(12) United States Patent
Boonekamp et al.

(10) Patent No.: US 7,905,635 B2
(45) Date of Patent: Mar. 15, 2011

(54) IMMERSED LEDS

(75) Inventors: Erik Boonekamp, Eindhoven (NL);
Jean P. Jacobs, Eindhoven (NL);
Maurice A. H. Donners, Eindhoven (NL)

(73) Assignee: Koninklijke Phillips Electronics N.V., Eindhoven (NL)

( * ) Notice: Subject to any disclaimer, the term of this patent is extended or adjusted under 35 U.S.C. 154(b) by 111 days.

(21) Appl. No.: 12/297,788

(22) PCT Filed: Apr. 18, 2007

(86) PCT No.: PCT/IB2007/051390
§ 371 (c)(1),
(2), (4) Date: Oct. 20, 2008

(87) PCT Pub. No.: WO2007/122555
PCT Pub. Date: Nov. 1, 2007

(65) Prior Publication Data
US 2009/0103298 A1  Apr. 23, 2009

(30) Foreign Application Priority Data

Apr. 25, 2006 (EP) .................... 06113019

(51) Int. Cl.
*F21V 5/02* (2006.01)
(52) U.S. Cl. ......... 362/311.02; 362/249.02; 362/311.14; 362/800
(58) Field of Classification Search ............. 362/249.02, 362/311.02, 311.05, 311.14, 613, 612, 222, 362/223, 217.05, 244, 307
See application file for complete search history.

(56) References Cited

U.S. PATENT DOCUMENTS

| | | | |
|---|---|---|---|
| 5,813,753 A * | 9/1998 | Vriens et al. ................... 362/293 |
| 6,250,774 B1 | 6/2001 | Regemann et al. |
| 2004/0238838 A1 | 12/2004 | Fujisawa et al. |
| 2005/0087750 A1 | 4/2005 | Braddell et al. |
| 2005/0265029 A1 | 12/2005 | Epstein et al. |
| 2005/0274967 A1 | 12/2005 | Martin et al. |
| 2005/0274973 A1 | 12/2005 | Takahashi et al. |

FOREIGN PATENT DOCUMENTS

| JP | 2000261041 A | * | 9/2000 |
|---|---|---|---|
| WO | 2004068596 A1 | | 8/2004 |

OTHER PUBLICATIONS

Machine translation of JP 2000-0261041.*

* cited by examiner

*Primary Examiner* — Jong-Suk (James) Lee
*Assistant Examiner* — Leah S Lovell

(57) ABSTRACT

The present invention relates to a LED-array system (202) comprising at least one LED package (200), said at least one LED package comprising a LED (204) and being arranged on a substrate (206) provided with means (208) for supplying the LED package (200) with a drive voltage, wherein said at least one LED package is immersed in a supporting layer (212) covering the substrate plate (206). In order to improve optical efficiency and reduce glare the LED package also comprises a reflector (220) having a reflective surface for collimating the light emitted by the LED (204). The invention also relates to lighting systems comprising the LED-array system and a method for producing said LED-array system.

6 Claims, 3 Drawing Sheets

IMMERSED LEDS

This application is a national stage application under 35 U.S.C. §371 of International Application No. PCT/IB2007/051390 filed on Apr. 18, 2007 and published in the English language on Nov. 1, 2007 as International Publication No. WO/2007/122555, which claims priority to European Application No. 06113019.1 filed on Apr. 25, 2006, all of which are hereby incorporated herein by reference.

The present invention relates to light emitting diodes (LEDs) incorporated in glass-like material.

Light emitting diodes (LEDs) incorporated in glass is currently fabricated for architectural light emitting elements. In these elements, two-dimensional LED arrays are sandwiched between two glass plates which laminated by a polymer, usually PVB (polyvinylbutyral). The LEDs are fixed on one glass plate on which a pattern of conductors is present to provide the current for the LEDs. The above construction is beneficial since it imparts durability to the construction, whereby the field of use increases.

A problem that is present for LEDs fully immersed in a glass like medium is that total internal reflection (TIR) occurs at the interface between the glass surface and the surrounding air. A consequence is that light with angles larger than the critical angle is totally reflected at the glass/air interface. The totally reflected light is however absorbed in the glass/PVB/glass system (by multiple internal reflections). In the case of an isolated LED in a large glass stack all totally reflected light is finally absorbed. However, at relatively high LED densities (e.g. $>0.5$ cm$^{-2}$) totally reflected light could scatter at neighbouring packages, leading to unpredictive light outcoupling.

When the LED system (as described above) is used for illumination purposes the performance is unacceptable because the optical efficiency is low and glare is not controlled; i.e. there are no means stopping light from exiting the LED-array system in unwanted directions.

The present invention aims at eliminating the above problems by providing a LED-array system in accordance with claim 1, comprising at least one LED in the form of a LED package arranged on a substrate provided with means for supplying the LED package with a drive voltage, wherein said at least one LED package is immersed in a supporting layer. Said LED-array system is characterised in that the LED package also comprises a reflector having a reflective surface for collimating the light emitted by the LED. The use of a reflective collimator makes it possible to increase the optical efficiency by reducing the total internal reflection (TIR) that occurs when the light emitted from the LED immersed in the supporting layer, having a refractive index higher than 1, is to pass the interface between said layer and the surrounding media, generally air. The reflector also makes it possible to reduce glare, that is, to keep the light emitted from the LED-array system within an angular range around a preferred direction, which is preferable for directed illumination purposes.

The LED-array system is preferably provided with a top layer arranged in such a way that it sandwiches the supporting layer between the top layer and the substrate. The top layer may serve as a protection from damage to increase the lifetime of the LED-array system. The resulting transparent luminaire is visually attractive and the inventive device makes it possible to integrate light emitting elements in transparent surfaces.

In a preferred embodiment the substrate and the top layer are made from glass and the supporting layer is made of polyvinyl butyral (PVB) having practically equal refractive indices. The combination of glass and PVB is well known for laminated glass.

The reflective surface of said collimator preferably has a cross section, orthogonal to a normal of the supporting layer, that is increasing as a function of distance from the LED and according to one embodiment it the reflective surface comprises a truncated cone extending from the LED. A truncated cone is not the ideal collimator but the simplicity of the shape makes it relatively easy, and thus cost efficient, to manufacture.

In order to increase the optical efficiency the reflective surface can comprise a compound parabolic concentrator (CPC). Since a CPC can be described mathematically it is possible to utilize ray tracing techniques in order to more accurately take skew rays etc into account, and in this way the shape of the CPC is optimized using ray tracing techniques to fulfil desired properties of the light emitted from the LED-array system.

A transparent cover can be arranged, essentially parallel to the supporting layer, on top of the reflector and the volume defined by the LED, the reflective surface and the transparent cover can be filled with a gaseous media. This arrangement makes it relatively simple to prefabricate the LED package and to store it without risking damage of the reflective surfaces and such.

According to one embodiment the reflective surface is preferably comprise a metallic reflective material and an interference coating. The reflector may consist of a solid metal or some other material, such as a ceramic, being coated with a metallic material. A metallic coating is a straightforward way to increase the reflectance of a surface and the reflective surface and the interference coating increases it further. A reflector consisting of a metallic material can be very robust and easy to handle, e.g. in the case of aluminium, and in other cases, such as when silver is used, the reflective surface needs to be sealed using, e.g., the transparent cover mentioned above.

In one embodiment a first volume adjacent and radially outside of the reflective surface is filled with a media having a reflective index that is lower than that of a second volume radially inside of the reflective surface, whereby light sent out from the LED experiences total reflection in said reflective surface. Total reflection in an interface between media with different refractive indices is a way to achieve a maximal optical efficiency for the system. This arrangement will generally have a aspect ratio (height divided by width relative to a direction normal to the substrate plate) that is slightly larger than for the previously mentioned case where the reflective surface is provided with a coating. Using total reflection in this context is therefore suitable for applications where the optical efficiency is of paramount importance while a slightly thicker LED-array system can be accepted. The resulting LED-array system on a whole will also be transparent to a higher degree than if the reflective surface comprises a metal. Depending on the application the feature of higher degree of transparency can provide both technical advantages as well as aesthetical value.

Total reflection is obtainable if the first volume comprises a gas with a refractive index of 1 and the second volume comprises a transparent material with a refractive index that is equivalent to the refractive index of the supporting layer, i.e. higher than 1. The latter feature reduces the number of refractive surfaces, reduces the complexity of the system, and also increases the transparent appearance of the system, though obviously total internal reflection will occur for some view angles.

By using an inventive system it is possible to avoid total internal reflection and thus increase the optical efficiency as well as keeping the glare on an acceptable level, at least below 500 cd/m², outside a desired directional cone.

In another aspect the production of the inventive LED-array system, basically comprises the following steps:
- arranging a LED package on a substrate plate provided with means for supplying the LED package with a drive voltage,
- applying a supporting layer of polymer over the LED package,
- heating the stack while applying a pressure and thus immersing the complete collimator in the polymer medium.

In the above method can also comprise the step of prefilling the collimator with a polymer, so as to improve processing.

Figure 1:
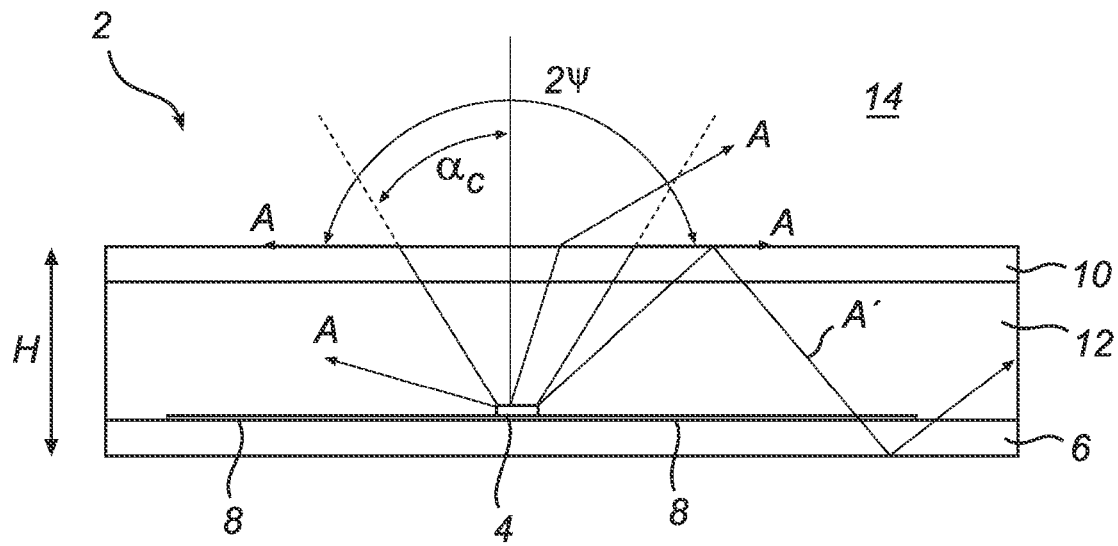
FIG. 1 is a schematic cross sectional view of a known illumination system.
Figure 5:
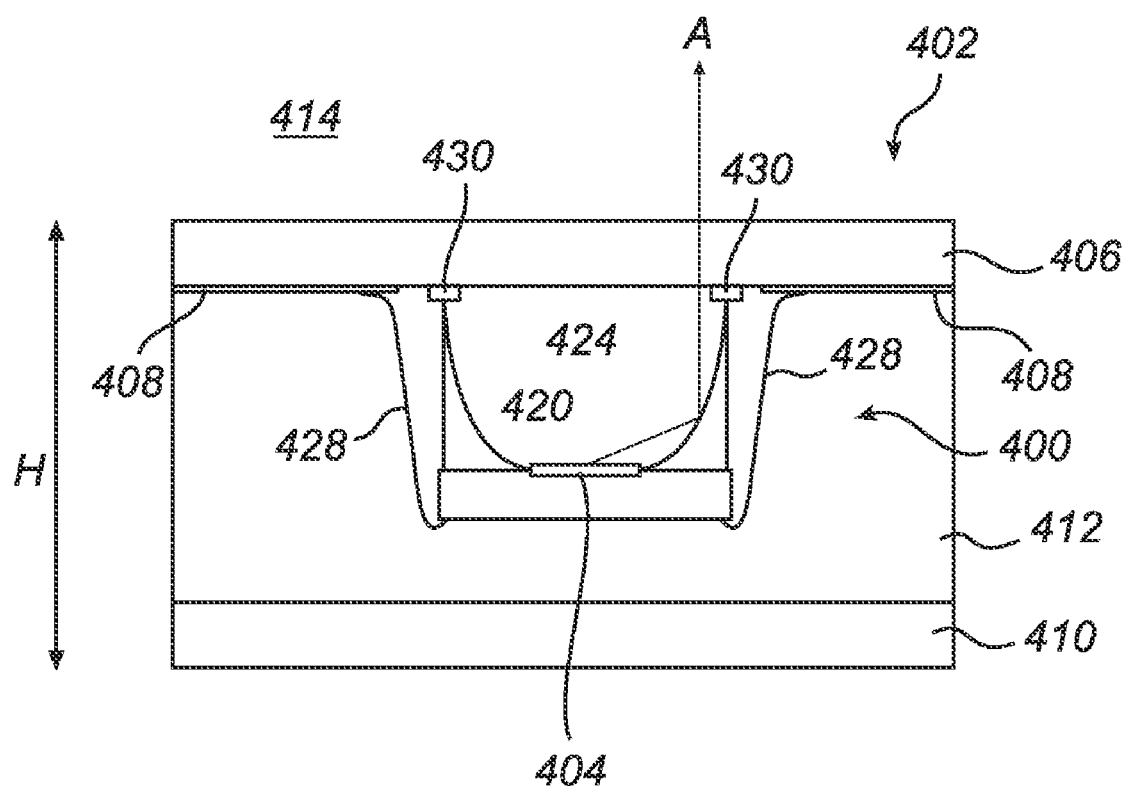

FIG. 5 is a schematic cross sectional view according to a fourth embodiment of the present invention FIG. 1 illustrates schematically a part of a system 2 where Lambertian LEDs 4 are arranged on a glass plate substrate 6. Transparent conductors 8, providing current to the LEDs 4, are present on the substrate 6. The LED 4 is sandwiched between the substrate 6 and a top glass plate 10 and is immersed in a polymer 12, generally polyvinylbutyral (PVB), which polymer 12 also provides for the adhesive force holding the glass plates 6, 10 together. The refractive index of PVB is similar to that of the glass and in the calculations to be described below it will be set to 1.5. The approximate height, H, of the sandwiched system is generally about 7-8 mm. The system is generally surrounded by air 14. Arrows A indicate light leaving the LED 4 and arrow A' indicates light experiencing total internal reflection.

The optical efficiency, $\eta$, that is, the amount of light leaving the top glass surface 10 divided by the total amount of light emitted from the LED 4, is low for the above system. The expected low optical efficiency when LEDs are immersed in a polymer/glass stack can be calculated quite easily using equation scheme 1.

$$P_1 = 4\pi \int_0^{\alpha_c} I_0 \cos(\alpha)\sin(\alpha)\, d\alpha \qquad \text{eq. 1}$$

$$P_2 = 4\pi \int_0^{\pi/2} I_0 \cos(\alpha)\sin(\alpha)\, d\alpha$$

$$\eta_{Lambertian,corrected} \approx \frac{P_1}{P_2} * \left(1 - \left(\frac{n-1}{n+1}\right)^2\right) * 100\%$$

$$\alpha_c = \arcsin\left(\frac{1}{n}\right)$$

$\alpha_c$ critical angle
$I_0$ intensity of the LED perpendicular to emitting plane (cd)
n refractive index ($n_{glass} \approx n_{PVB} = 1.50$)

For a refractive index of n~1.50, about 60% of the light is absorbed within the system for a Lambertian emitting LED. Only light within the so-called escape cone ($\alpha < \alpha_c$) contributes to the emitted flux from the LED. Most LED packages produce a wide (almost Lambertian) beam and losses are large when incorporated in high index media.

In the above situation the emitted flux is emitted over a space angle of $2\pi$. However, for illumination purposes, glare is unacceptable. In this context glare corresponds to light emitted outside of a preferred radiation cone, defined by $2\Psi$ in the figures. A general guide is to keep the luminance of the illumination system below 500-1000 cd/m² for angles $\Psi > 60$ degrees. For a typical LED generating 10 lm from a surface of 5 mm², the luminance over the whole hemisphere is ~1 Mcd/m² as calculated using equation 2.

$$\frac{\Phi}{S} = \pi L \qquad \text{eq. 2}$$

$\Phi$ emitted flux by LED (lm)
S emitting surface (m²)
L luminance (cd/m²)

The invention provides a way to increase the optical efficiency considerably and to solve the glare issue completely. The key is to design a LED package having specular reflective inner walls with a particular shape and low aspect ratio. A low aspect ratio implies a thin system, which improves the aesthetic impression, reduces the amount of PVB that needs to be used, and thereby the cost. Also, a thinner system reduces light absorption by the PVB, preventing the light absorption from being too pronounced.

The light emitted by the LED 4 should be collimated to optimize optical efficiency and glare. The invention proposes the use of reflective elements to tune these parameters.

Figure 2:
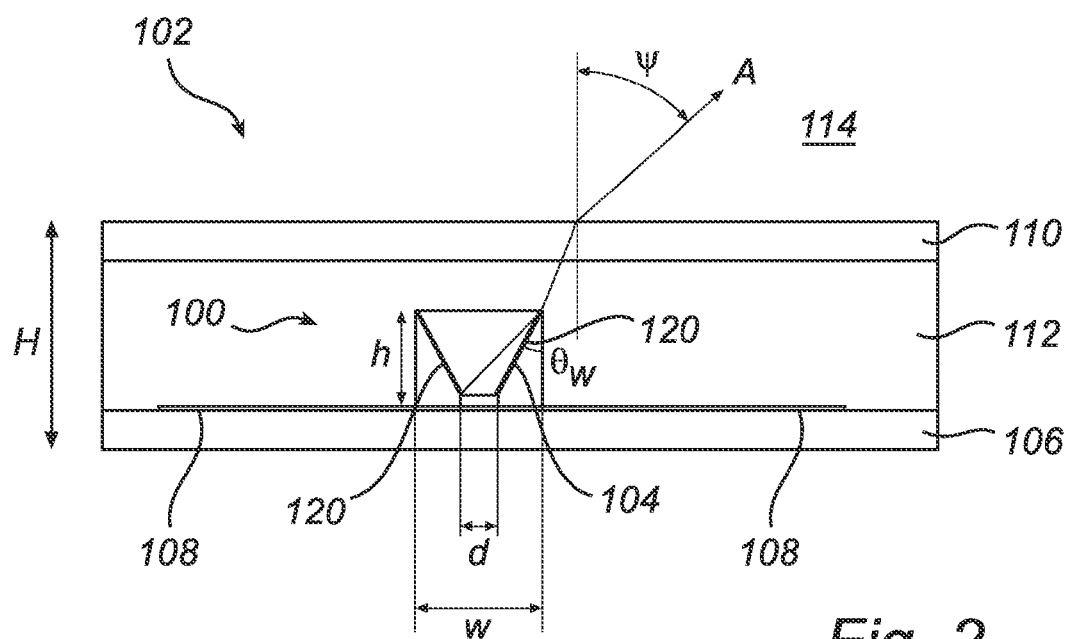
FIG. 2 is a schematic cross sectional view according to a first embodiment of the present invention.

A first embodiment of the inventive LED-array system 102 is shown in FIG. 2. Arrows A still indicate light leaving the LED 104. In this embodiment LED packages 100 are arranged on a glass plate substrate 106. Transparent conductors 108 provide drive current to the LEDs 104. The LED packages 100 also comprise reflective side walls 120, extending from the LEDs 104 and being angled radially outwards from the LED 104. The side walls 120 generally extend over a height, h, and a width, w, and are angled by a wall angle, $\theta_w$, relative to a normal of the sandwiched layers. The LED packages 100 are immersed in PVB 112 and a top glass plate 110 is arranged onto the PVB layer 112. The goal is to increase optical efficiency and reduce glare and by selecting the proper aspect ratio (h/w) and wall angle ($\theta_w$), the light is collimated in such a way that total internal reflection is avoided and the glare is absent. The parameters h/w and $\theta_w$ can be calculated for a two-dimensional case. The three-dimensional element (conical, square, hexagonal) can than be constructed. Fine-tuning the angle distribution of the light is then possible using ray-tracing techniques. A wedge angle $\theta_w$ of the collimated elements can be calculated using:

$$\theta = \frac{\frac{\pi}{2} - \arcsin\left(\frac{\sin\psi}{n}\right)}{2N} \qquad \text{eq. 3}$$

N maximum nr. of reflections inside the collimator
$\Psi$ exit angle (radians)
$\theta$ wedge angle collimator (radians)

The associated aspect ratio (h/w) of the collimator is given by $$\frac{h}{w} = \frac{1}{\frac{1}{(h_N/d)} + 2\tan\theta} \quad \text{eq. 4}$$

where $$\frac{h_N}{d} = \frac{1 + 2\tan\theta \sum_{i=1}^{N-1} h_i/d}{\tan(\frac{\pi}{2} - 2N\theta) - \tan\theta} \quad \text{eq. 5}$$

h height collimator (m)
w width collimator (m)
d entrance size collimator (m)

As an example, assume that Ψ=60 degrees (required for proper glare protection), the aspect ratio (h/w) of the collimator is 1.18 at wedge angle θ=13.7 degrees. Light escapes now in a cone of 120 degrees. At the same time total internal reflection (TIR) is avoided at the interface between the glass 108 and the air 114 since $$\arcsin\left(\frac{\sin\psi}{n}\right) < \alpha_c. \quad \text{eq. 6}$$

Efficiency is high because TIR is avoided and no light escapes the glass 108 at high (>60 degrees) angles (glare-free). In terms of optical efficiency and etendue a more favourable reflector shape is a CPC. A CPC is also more compact, thus reducing the height of the sandwiched system.

Though only the function of a single LED package has been described it should be understood that the LED array system generally comprises several LED packages.

Figure 3:
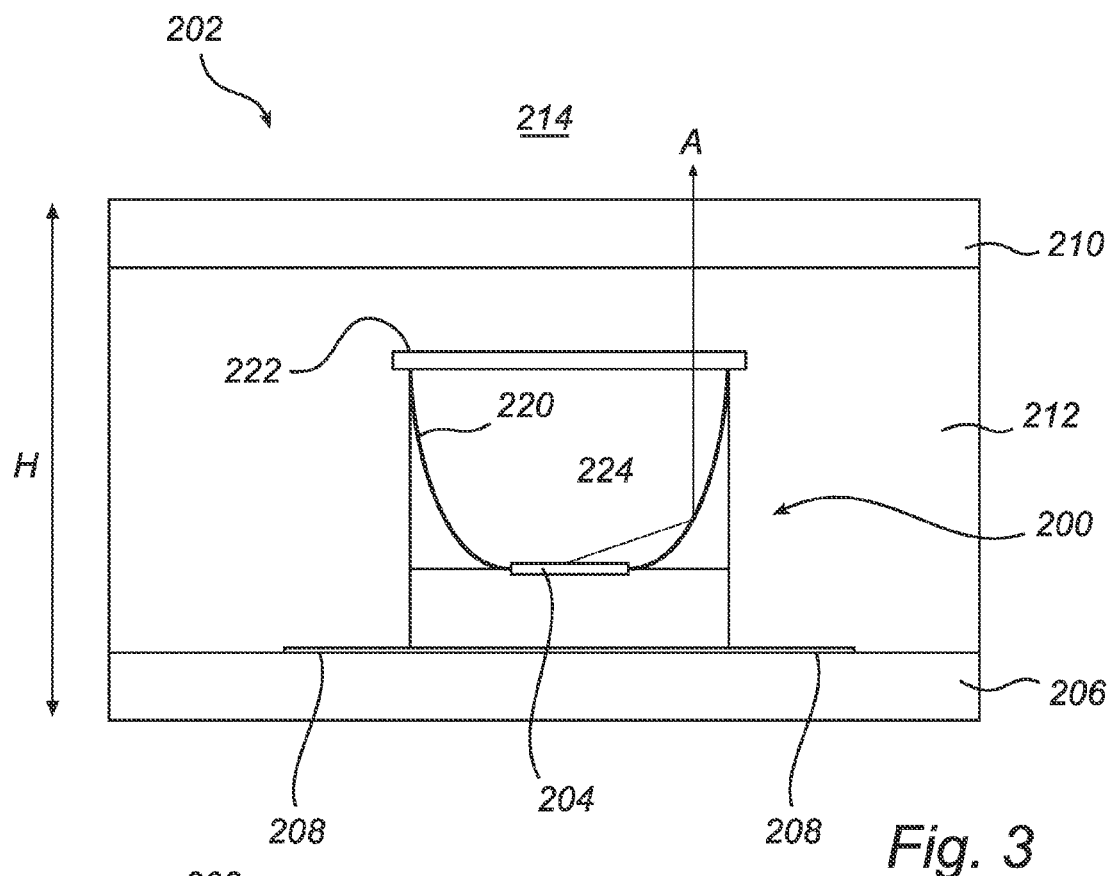
FIG. 3 is a schematic cross sectional view according to a second embodiment of the present invention.

A second exemplifying embodiment of the invention is shown in FIG. 3. The general structural components are similar to those of the first embodiment; a LED package 200 is immersed in a PVB layer 212 sandwiched between two glass plates 206, 208. In this embodiment, however, the LED package 212 comprise a reflective CPC 220 extending from the LED 204. A transparent cover 222 is provided onto the CPC 220, such that an air void 224 is present in the area defined by the LED 204, the walls of the CPC 220, and said cover 222. The CPC 220 consists of solid aluminum or metallised ceramic/polymer and provides for reflective collimation of the light leaving the LED 204.

Figure 4:
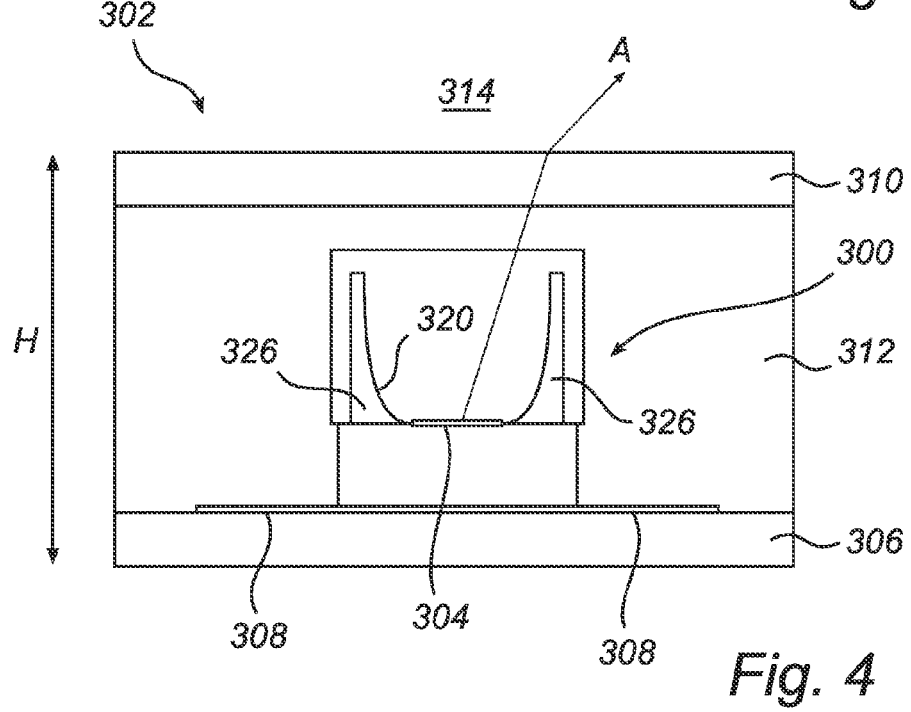
FIG. 4 is a schematic cross sectional view according to a third embodiment of the present invention.

FIG. 4 illustrates an inventive system according to a third embodiment of the invention. Again it is only the LED-package 300 that differs from previous embodiments. In this embodiment the reflective walls comprise a solid CPC structure 320 (e.g. PMMA or glass or transparent ceramic) that can be arranged directly on top of the LED 304. The CPC 320 is basically an inversion of the CPC presented in relation to the second embodiment. The inner wall of a concentric air void 326 defines the reflective surfaces that effectively reflects the light emitted from the LED 304 by TIR. The invention according to this embodiment will be transparent to a higher degree than what is the case for the other embodiments.

FIG. 5 shows a fourth embodiment of the invention. In this embodiment the transparent cover 222 of the second embodiment has been eliminated by arranging the LED package 400 upside-down on the glass plate 406 on which the transparent conductors 408 are arranged. The glass plate 406 thus serves as a substrate for the LED package 400 as well as a transparent cover. The electrical contact between the transparent conductors 408 and the LED package is provided by wires 428. The LED package 400 is glued to the glass plate 406 using suitable adhesive means. The construction reduces the thickness of the system as compared to the second embodiment. In one aspect the wires 428 are rigid enough to press against the transparent conductors 408 once the LED package 400 is glued 430 to the glass plate 406 This will ensure electrical contact without the use of further bonding/soldering, especially after the whole system 402 is laminated.

Aspects such as cost, complexity and size has to be considered when choosing between the various solutions. For instance, the third embodiment provides for the best optical efficiency but it also the solution that results in the largest aspect ratio and currently also a relatively expensive solution as compared to the solution described in relation to the first embodiment.

A comparison between the prior art device and the second and third embodiment is shown in table 1.

TABLE 1

Comparison between prior art solutions and the present invention as calculated with ray tracing techniques.

| Configuration | Optical efficiency (ray tracing) [%] | Total thickness [mm] (cover excluded) | Glare Present? |
|---|---|---|---|
| LED in glass | 43 | 0.8 | Yes |
| Second embodiment | 88 [*] | 2.5 | No |
| Third embodiment | >90 | 6.0 | No |

[*] Aluminum reflectance in air, R = 92.1% (550 nm)

The manufacturing method is similar for all embodiments, the difference being related to the construction of the LED package. The LED packages 100, 200, 300, 400 are provided with the reflective optics 120, 220, 320, 420 and mounted on the glass plate 106, 206, 306, 406 with the applied transparent conductive areas. After applying the PVB, 112, 212, 312, 412 and the upper glass plate 108, 208, 308, 408 the stack is in general heated to typically 100° C. while applying a pressure of ~10 bar. The complete collimator 120, 220, 320, 420 is thus immersed in the polymer medium 112, 212, 312, 412. Pre-filling the collimator 112, 312 with polymer may improve processing.

Though described in general terms there are many specific areas where use of the inventive system is envisaged. These areas include lighting systems such as luminaires, showcases, light-emitting ceiling tiles, automotive lighting (e.g. brake lights) and so forth. Also, other materials than glass, such as various ceramics etc having suitable optical properties, can be used for the inventive system.

The invention claimed is:
1. An LED-array system comprising:
a glass substrate;
at least one LED package immersed in a supporting layer and arranged on said glass substrate, the at least one LED package comprising an LED,
a top layer disposed over the supporting layer;
a concentric air void surrounding said LED and extending upwards from said LED to said top layer; and
an LED voltage driver for powering said at least one LED;
wherein said concentric air void forms a compound parabolic concentrator directly above said LED and reflects light emitted by said LED.

2. The LED-array system according to claim 1, wherein the substrate and/or the top layer are made of glass and the supporting layer is made of PVB.

3. The LED-array system according to claim 1, wherein said reflective surface has a cross section, orthogonal to a normal of the supporting layer, that is increasing as a function of distance from the LED.

4. The LED-array system according to claim 1, configured to keep glare below 500 cd/m$^2$ outside a desired directional cone 2$\psi$.

5. A lighting system including an LED-array system according to claim 1.

6. An LED array system comprising:
at least one LED supported on a glass plate substrate and substantially surrounded by a supporting layer material;
a parabolic concentrator over-laying said LED and extending away from said glass plate substrate;
a transparent cover sealed to said parabolic concentrator;
an air void defined in an interior space within said parabolic concentrator and said transparent cover;
a glass top above said cover and said supporting layer material;
wherein said air void is filled with a gaseous media and wherein said supporting layer has a refractive index lower than a refractive index of said gaseous media.

* * * * *